United States Patent
Goodnow et al.

(10) Patent No.: US 6,541,997 B1
(45) Date of Patent: Apr. 1, 2003

(54) CLOCKLESS IMPEDANCE CONTROLLER

(75) Inventors: Kenneth J. Goodnow, Essex, VT (US); Riyon Harding, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,835

(22) Filed: Oct. 23, 2001

(51) Int. Cl.[7] .............................................. H03K 17/16
(52) U.S. Cl. ........................... 326/30; 326/32; 326/34; 326/87
(58) Field of Search ............................. 326/26, 27, 30, 326/86, 90

(56) References Cited

U.S. PATENT DOCUMENTS

| | | |
|---|---|---|
| 5,134,311 A | * 7/1992 | Biber et al. .................. 307/270 |
| 5,369,570 A | 11/1994 | Parad |
| 5,440,681 A | 8/1995 | Kudo |
| 5,442,561 A | 8/1995 | Yoshizawa et al. |
| 5,448,182 A | * 9/1995 | Countryman et al. ......... 326/30 |
| 5,463,555 A | 10/1995 | Ward et al. |
| 5,479,343 A | 12/1995 | Matoba et al. |
| 5,657,453 A | 8/1997 | Taoka et al. |
| 5,787,283 A | 7/1998 | Chin et al. |
| 5,890,133 A | 3/1999 | Ernst |
| 5,890,134 A | 3/1999 | Fox |
| 5,983,194 A | 11/1999 | Hogge et al. |
| 6,032,121 A | 2/2000 | Dietrich et al. |
| 6,049,774 A | 4/2000 | Roy |
| 6,101,479 A | 8/2000 | Shaw |
| 6,141,598 A | 10/2000 | Nam |
| 6,141,647 A | 10/2000 | Meijer et al. |
| 6,144,647 A | 11/2000 | Lopez-Torres |
| 6,144,893 A | 11/2000 | Van Der Vegt. et al. |
| 6,356,105 B1 | * 3/2002 | Volk ............................. 326/30 |

* cited by examiner

*Primary Examiner*—Michael Tokar
*Assistant Examiner*—Anh Q. Tran
(74) *Attorney, Agent, or Firm*—McGinn & Gibb, PLLC; Richard A. Henkler, Esq.

(57) ABSTRACT

An impedance controller comprises impedance control logic outputting an adjustable impedance and a comparator comparing the adjustable impedance with a reference voltage. The impedance control logic recalibrates said adjustable impedance only when said comparator indicates a change in impedance.

16 Claims, 3 Drawing Sheets

CLOCKLESS IMPEDANCE CONTROLLER

BACKGROUND OF THE INVENTION

Field of the Invention

With the ever-increasing speed of digital circuits comes the problem of running subcircuits at speeds in excess of their minimum requirements (e.g., not at their maximum performance capabilities), thus wasting system resources for power. Impedance controllers in particular, can perform functionally at or below 1 MHz. However, they are often incorporated into a system running at 500 MHz plus. Due to the nature of digital circuits, the impedance controller is forced to run off of the system clock or some division thereof. The clock speed is generally well above the speed needed by the controller. By running at higher speeds than is necessary, the power consuming portions of the circuit operate more frequently than is necessary, thereby wasting power. The main system clock can be slowed by dividing the system clock. However, dividing system clocks creates more system clocking issues and requires more power for the system.

Additionally, analog impedance control circuits can take up areas hundreds of times larger than those of their digital counterparts.

Therefore, there is a need for an impedance controller that operates digitally and that runs independently of the system clock. The invention described below provides such a controller that does not use the system clock, but instead updates as the impedance of the I/O drivers to match that of the off-chip circuit.

The present invention generally relates to impedance controllers and more particularly to an improved impedance controller that does not utilize a clock signal and, by being free of the clock signal, the invention can operate at its optimum speed independently of the clock signal of the device in which it is embodied.

BRIEF SUMMARY OF THE INVENTION

In view of the foregoing and other problems, disadvantages, and drawbacks of the conventional impedance controller, the present invention has been devised, and it is an object of the present invention to provide a structure for an impedance controller that does not rely upon any external clock signal and is free to operate at its optimum speed.

In order to attain the object(s) suggested above, there is provided, according to one aspect of the invention, an impedance controller that has an impedance control logic outputting an adjustable impedance and a comparator comparing the adjustable impedance with a reference voltage. The impedance control logic recalibrates the adjustable impedance only when the comparator indicates a change in impedance. The impedance control logic recalibrates the adjustable impedance independently of a system clock signal. The comparator comprises a dual differential amplifier comparator. The dual differential amplifier comparator includes a first differential amplifier comparator adapted to identify a high impedance and a second differential amplifier comparator adapted to identify a low impedance. The impedance controller has an alternating incremental impedance adjustment circuit adapted to converge the adjustable impedance and an inverse adjustable impedance to an amount less than the high impedance and greater than the low impedance, as controlled by the first differential amplifier and the second differential amplifier. The alternating incremental impedance adjustment circuit has a counter adapted to generate the adjustable impedance and an inverter adapted to generate the inverted adjustable impedance. The invention also has a plurality of latches adapted to temporarily hold the adjustable impedance. The inverted adjustable impedance and multiplexors select between increment values of the adjustable impedance and the inverted adjustable impedance until one of the adjustable impedance and the inverted adjustable impedance is substantially equivalent to the reference voltage. The impedance controller includes an enable signal that controls the multiplexors in incrementing values of the adjustable impedance and the inverted adjustable impedance.

Implementing the ideas contained in this invention could save power resources in systems using standard impedance controllers which run off system clocks or some division thereof. Secondly, this impedance controller circuit runs on demand when there is a change in impedance. Thus, it is idle a large percentage of the time. Finally, it saves designers from dealing with clock synchronization issues because the controller works off its own generated recalibration signal which does not need to be synchronous with a system clock. Systems that implement the design described within will also benefit from area savings. Since there are no clock tree circuits within the design, the area normally consumed by these circuits is available for additional system logic and added functionality. In systems with many impedance controllers on a system on a chip (SoC), the area savings become greater the more these improved impedance controllers replace traditional system clock driven controllers. In fact, any system that currently implements an impedance controller design could benefit from the use of this improved controller. Older designs could be reworked to implement the new impedance controllers and future designs could make these controllers the new standard.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which.

DETAILED DESCRIPTION OF THE INVENTION

As mentioned above, there is a need for an impedance controller that operates digitally and that runs independently of the system clock. The invention addresses this need and provides a "clockless" impedance controller that runs on-demand. With the inventive impedance controller, only when there is a change in impedance of the system does the controller respond (rather than at regular cycles of a system clock). The change in impedance is detected by a set of dual differential amplifiers. The change in impedance acts as a "clock" for the impedance controller sub-circuit. The circuit also ensures that there will be a continuous change in the outputs of the two comparators during each impedance control phase until the reference impedance is matched. The inventive impedance controller is thus independent of the system clock and can be utilized in any electronic system regardless of the system's speed. The impedance control on-demand device saves much needed power resources for other functions within a given system.

Figure 1:
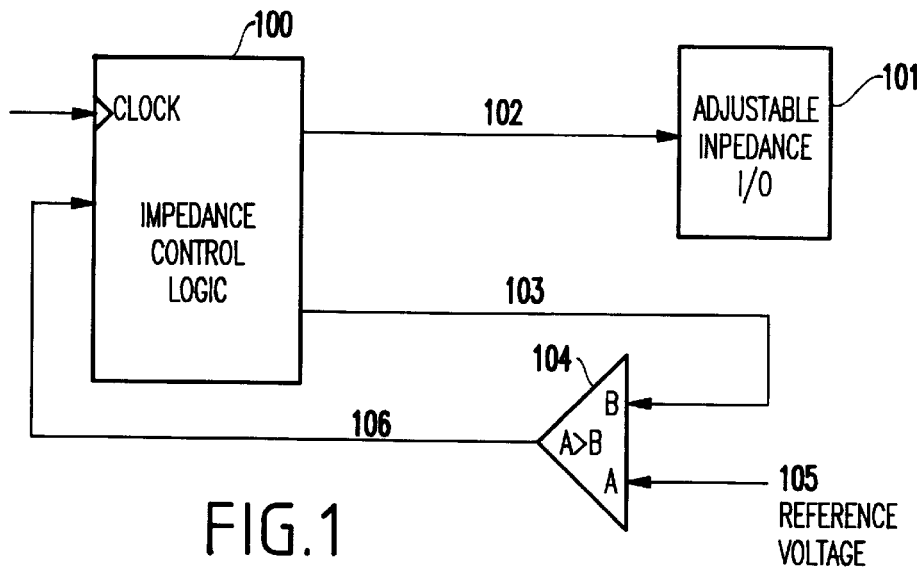
FIG. 1 is a schematic diagram of an impedance controller.

As shown in FIG. 1, an impedance controller that relies upon an external clock signal normally take a reference voltage (105) from the I/O and compares it to the impedance of the I/O drivers (104). The analog comparison yields a logical '1' if the impedance of the drivers is too high or a '0' if too low. The impedance control logic (100) contains a counter which calculates a new impedance by counting up or down accordingly until the impedances are the same.

Figure 2:
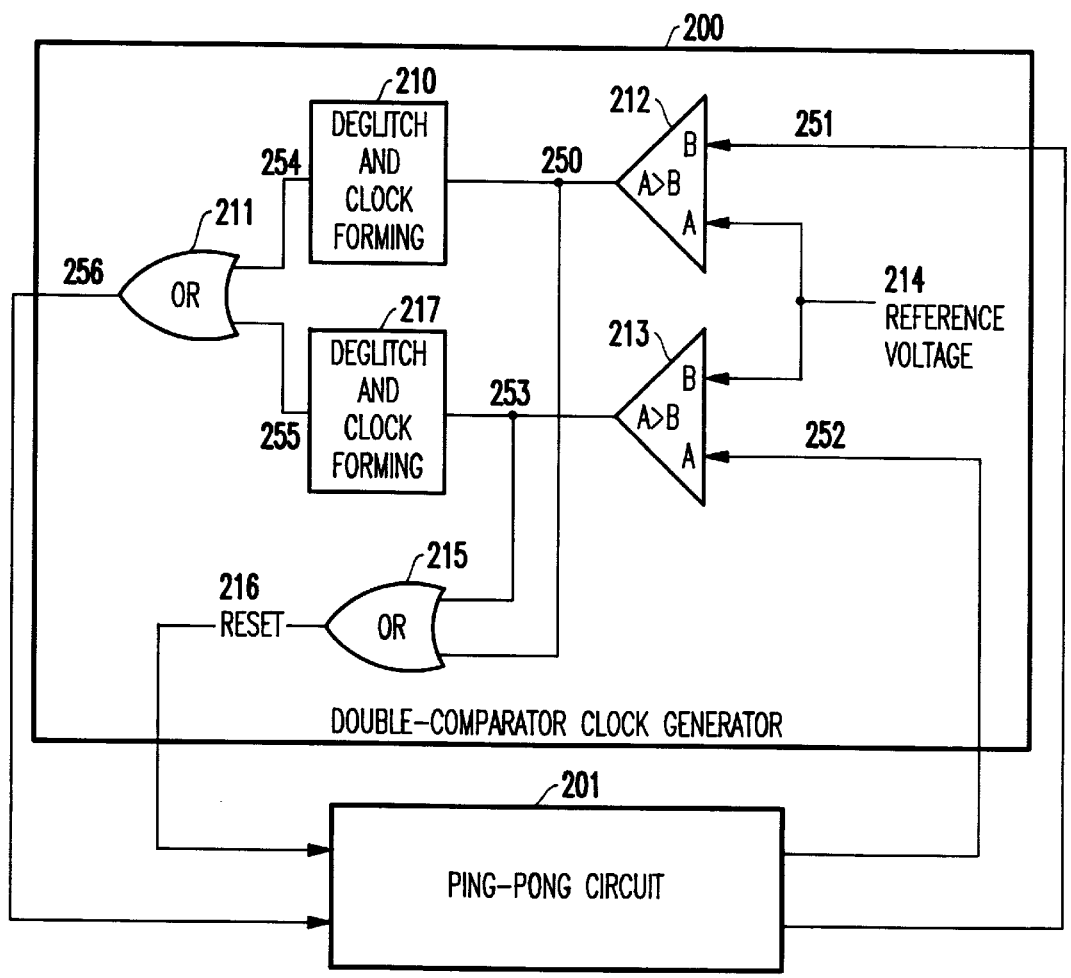
FIG. 2 is a schematic diagram of an impedance controller.

The invention makes a range out of the calculated impedance from the impedance control logic (103) and uses two differential amplifiers to compare the reference impedance to that range (212, 213), as show in FIG. 2. If the reference impedance is within that range then the new impedance is sent to the adjustable impedance I/O (101) and the output of the comparators is '00' (211). If the reference impedance does not fall in that range then there is a change required and the output is '01' if the actual impedance is too low or '10' if it is too high.

This changing output generates the edges necessary to create an "impedance change signal" (210, 217). This impedance change signal is somewhat analogous to a conventional clock signal in that it causes the impedance to be recalibrated, and is sometimes referred to herein as a "clock" or CLK signal herein. However, this signal is different than a conventional clock signal (that finds it origins with the system clock signal) because the inventive impedance change signal is completely independent of the external clock signal and is not a regular periodic signal and is only active when there is an impedance change. The impedance change signal is a signal that is internal only to the impedance controller and is activated only when there is an impedance change (as opposed to a conventional clock signal that activates on a regular cyclical basis). At each such impedance change signal, a new impedance is calculated from first, the inverse at the previous calculated impedance, then the increment of the calculated impedance-two-impedance change signals, creating a Ping-Pong effect. The Ping-Pong effect is a decaying wave function that converges on the correct impedance (201). For example, assuming a 3 bit input, if the reference voltage is 4.5 the comparators would first use a range of b'000 (213-A) and b'001 (212-B), the next impedance change signal would use 6 (b'110) and 7 (b'111) [Inverse of b'001], the next 1 (b'001) [Increment 0+1=1] and 2 (b'010), then 5 (b'101) and 6 (b'110) [Inverse of b'001], then 2 (b'010) [Increment 1+1=2] and 3 (b'011) then 4 (b'100) and 5 (b'101) [inverse of b'010]. Here the comparing would stop because the impedance of 4–5 is a match and the new impedance is driven out the adjustable impedance I/O.

Figure 3:
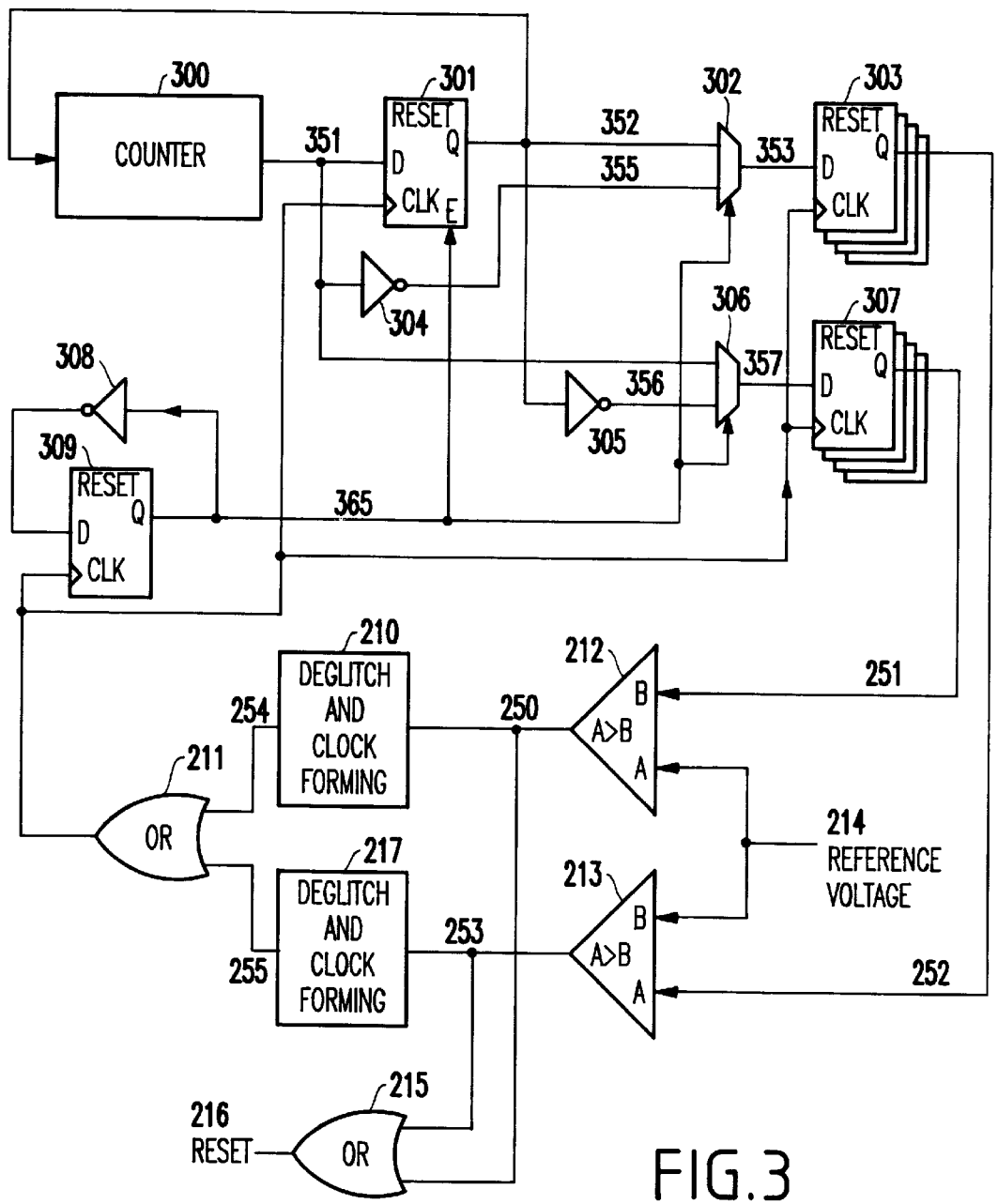
FIG. 3 is a schematic diagram of an impedance controller.

In order to generate an impedance change signal for the impedance control logic to function, the invention uses dual differential amplifier (212, 213) comparators. One differential amp (212) is the "impedance is too high" (A>B where A=Ref and B=calculated Impedance) comparator and the other is "impedance is too low" (A>B where A calculated impedance and B =Ref) comparator (213). Each generates a logical '1' when its state is true or a logical '0' when its state is false. The reference voltage as well as the calculated impedance are fed into the comparators. As shown in FIG. 3, the low differential amp (213) gets its input from set, reset switch 303 which is always one less than the input to the hi differential amp from 307. Therefore, the calculated impedance differs by '1' as the input to each differential amp. For example, if the calculated impedance is 50 ohms and the reference impedance is 45 ohms, the low differential amp will receive inputs of 49 and 45 while the high differential amp will receive inputs of 50 and 45. The output of the high comparator (250) will indicate that the driving impedance is too high or logical '1' (50>45=TRUE). The output of the low comparator (253) will be a logical '0' because its impedance is NOT too low (45>49=FALSE). This two bit output is then or'ed together (215) and used as the reset line (216) for the Ping-Pong circuit (202). This will also be used as the "enable signal" for the final latch which ultimately drives the new impedance to the I/O drivers (0 or 0=0). The two bit output is also sent to two deglitching and impedance change signal generation circuits (210, 217), the output of which is then or'ed together (211) and used in the Ping-Pong circuit as the "system impedance change signal" (256), which, as discussed above, is somewhat analogous to the conventional system clock signal.

An example embodiment for a linear count-type impedance control circuit (e.g., ping pong circuit (201) is shown in detail in FIG. 3. However, as would be known by one ordinarily skilled in the art, the invention is not limited to a linear embodiment and, instead, the invention can be similarly used in circuits that use a shift-type impedance control. In FIG. 3, the enable generator (308, 309) consists of a set, reset D-Flip-Flop (309) and an inverter (308). At each rising edge of the new system impedance change signal, a pulse is generated from the enable generator (365) which feeds a latch (301) for the counter value (300) and the multi plexors (302, 306) which select the new impedance value. In effect, the enable signal (365) is one half of the system impedance change signal (256).

The counter (300) begins to count up from 0 on system reset. It is purely combinatorial logic and is not clock dependent. The counter adds '1' to its input which comes from the output (352) of a latch (301) which is clocked and enabled. The output of the counter is latched on the rising edge of an "impedance change signal" pulse after enable (365) is high. The output of that latch (352) is taken as input to the low differential amp multiplexor (302). This output (352) is always '1' less than the output of the counter (351), which is the input to the hi differential amp multiplexor (306). The inverse of the latch output (356), through inverter (305), is the inverted input to the hi differential amp multiplexor (306) while the inverted counter output (355), through inverter (304) is the inverted input to the low differential amp multiplexor (302). Each multiplexor selects the counter value (351) or counter −1 (352) when sel='0' and its inverse when sel='1'. The select signal is generated from the enable generator circuit (308, 309). For example, if the counter value (351) is b'0001, the latch value (352) is b'0000 and sel='0' then output from the low multiplexor (353) is b'0000 and the output from the hi multiplexor (357) is b'0001. When sel='1' the low multiplexor (353) will produce an output of b'1110 and the hi multiplexor (357) selects b'1111 (the inverses of b'0001 and b'0000 respectively). The low multiplexor latch (303) and the hi multiplexor latch (307) pass their inputs from the multiplexors as outputs back to their respective differential amps for another comparison (354, 358).

Figure 4:
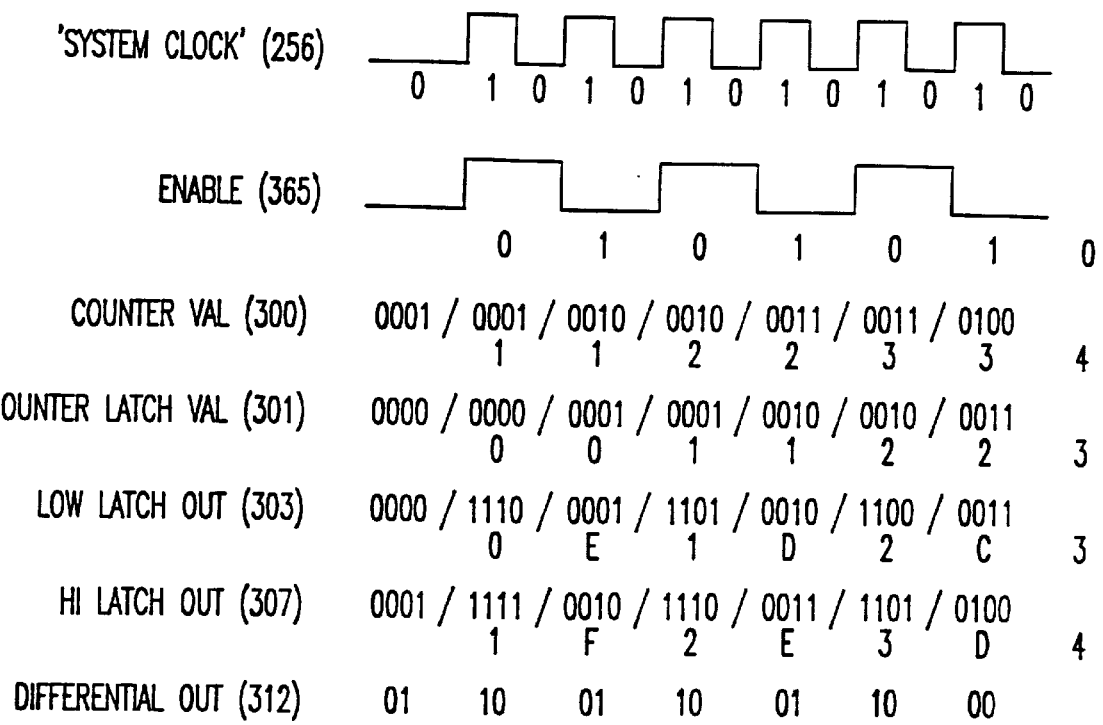
FIG. 4 is a timing diagram of the signals within the impedance controller shown in FIG. 3.

The waveforms of the signals processed by the circuit shown in FIG. 3 are shown in FIG. 4. In this example, a 4 bit impedance signal is used, the reference voltage is 4.5 and the system is reset to 0 on power up. As discussed above and as shown in FIG. 4, the enable signal (365) is one half of the system impedance change signal (256). As the counter (300)

values go up, the counter latch (301) values increase and are behind by one, as discussed above. The value of Low Latch Out (303) in FIG. 4 starts at 0000 because the system is reset to '0' at power-up or after an impedance change is detected. The value of High Latch Out (307) is 0001 because it is always one higher than the Low Latch Out value (303). Now at (213), A=0 and B=4.5 (ref impedance). Since A is NOT greater than B the output of (213) is false or a logical 0. Similarly, at (212) A=4.5 (ref impedance) and B=1. Here A is indeed greater than B so the output is true or a logical 1. Therefore the Differential Out (312) value is 01 (213=0, 212=1). At the next rising edge of the enable signal (365) the muxes select the inverted counter values thus Low Latch Out (303) becomes the inverse of b'0001 which is b'1110 as seen in the second cycle of FIG. 4. Similarly, High Latch Out (307) becomes the inverse of b'0000 which is b'1111. Now the values of A and B at (213) are b'1110 (or decimal 14 or hexidecimal E) and 4.5 respectively. The comparator tests for A>B and the result is true or logical '1'. At (212) A =4.5 and B=b'1111 (or decimal 15 or hexidecimal F). The result of A>B is now false so the output of (212) is a '0'. The value of Differential Out (312) is now b'10 (213=1, 212=0). It can be seen in FIG. 4 that the value of Differential Out (312) changed from b'01 to b'10. This causes the value of the enable signal (365) to change to '0' and the whole cycle begins again. Now the new counter values are used. Low Latch Out (303) now gets b'0001 and High Latch Out (307) now becomes b'0010 (or decimal 2). The process repeats until the circuit converges on the actual impedance value then it sends that value to the I/O's. The circuit then holds until there is another change in impedance detected and the process begins again.

Thus, the invention provides an impedance controller that can operate at its own pace and that is free of the system clock of the device to which it is connected. This allows the inventive impedance controller to perform many less operations per time period than does a conventional impedance controller, thereby saving substantial power. Because the inventive impedance controller does not receive a regular clock signal, it utilizes dual circuits (the dual differential amplifiers), one of which continues to recalibrate the impedance level so long as the impedance is to low, while the other circuit continues to recalibrate the impedance level so long as the impedance is to high. Therefore, the inventive circuit will only stop the recalibration process when the value is stabilized above the "low" value and below the "high" value. Such dual circuits allow the impedance level to be stabilized (through successive recalibration cycles) without having to rely upon a cyclical clock cycle. This substantially reduces the power consumed by the impedance controller by operating the impedance controller's power consuming calibration process only when necessary.

Any system that implements an impedance controller could benefit from this invention. Firstly, implementing the ideas contained in this invention could save power resources in systems using standard impedance controllers which run off system clocks or some division thereof. Secondly, this impedance controller circuit runs on demand when there is a change in impedance. Thus, it is idle a large percentage of the time. Finally, it saves designers from dealing with clock synchronization issues because the controller works off its own generated recalibration signal which does not need to be synchronous with a system clock. Systems that implement the design described within will also benefit from area savings. Since there are no clock tree circuits within the design, the area normally consumed by these circuits is available for additional system logic and added functionality. In systems with many impedance controllers on a system on a chip (SoC), the area savings become greater the more these improved impedance controllers replace traditional system clock driven controllers. In fact, any system that currently implements an impedance controller design could benefit from the use of this improved controller. Older designs could be reworked to implement the new impedance controllers and future designs could make these controllers the new standard.

While the invention has been described in terms of preferred embodiments, those skilled in the art will recognize that the invention can be practiced with modification within the spirit and scope of the appended claims.

What is claimed is:

1. An impedance controller comprising:
   a dual differential amplifier comparator comparing an adjustable impedance with a reference voltage, a first one of the differential amplifier comparators adapted to identify a high impedance, and a second one of the differential amplifier comparators adapted to identify a low impedance;
   impedance control logic outputting the adjustable impedance, the impedance control logic recalibrating the adjustable impedance only when said comparator indicates a change in impedance independently of a system clock; and
   an alternating incremental impedance adjustment circuit adapted to converge said adjustable impedance and an inverse adjustable impedance to an amount less than said high impedance and greater than said low impedance, as controlled by said first differential amplifier and said second differential amplifier.

2. The impedance controller in claim 1, wherein said alternating incremental impedance adjustment circuit comprises:
   a counter adapted to generate said adjustable impedance;
   an inverter adapted to generate said inverted adjustable impede;
   a plurality of latches adapted to temporarily hold said adjustable impedance and said inverted adjustable impedance; and
   multiplexors that select between increment values of said adjustable impedance and said inverted adjustable impedance until one of said adjustable impedance and said inverted adjustable impedance is subtly equivalent to said reference voltage.

3. The impedance controller in claim 2, wherein said impedance controller includes an enable signal for controlling said multiplexors in incrementing values of said adjustable impedance and said inverted adjustable impedance.

4. An impedance controller comprising:
   impedance control logic outputting an adjustable impedance; and
   at least one set of dual comparators comparing a high value of said adjustable impedance with a reference voltage and a low value of said adjustable impedance with said reference voltage,
   wherein said impedance control logic recalibrates said adjustable impedance only when said comparator indicates that said reference voltage is above said high value or below said low value.

5. The impedance controller in claim 4, wherein said impedance control logic recalibrates said adjustable independently of a system clock signal.

6. The impedance controller in claim 4, wherein said dual comparators comprise a dual differential amplifier comparator.

7. The impedance controller in claim 6, wherein said dual differential amplifier comparator includes a first differential amplifier comparator adapted to identify when said reference voltage exceeds said high value and a second differential amplifier comparator adapted to identify when said reference voltage subceeds said low value.

8. The impedance controller in claim 7, further comprising an alternating incremental impedance adjustment circuit adapted to converge said adjustable impedance and an inverse adjustable impedance to an amount less than said high impedance and greater than said low impedance, as controlled by said first differential amplifier and said second differential amplifier.

9. The impedance controller in claim 8, wherein said alternating incremental impedance adjustment circuit comprises:

a counter adapted to generate said adjustable impedance;

an inverter adapted to generate said inverted adjustable impedance;

a plurality of latches adapted to temporarily hold said adjustable impedance and said inverted adjustable impedance; and multiplexors that select between increment values of said adjustable impedance and said inverted adjustable impedance until one of said adjustable impedance and said inverted adjustable impedance value is substantially equivalent to said reference voltage.

10. The impedance controller in claim 9, wherein said impedance controller includes an enable signal for controlling said multiplexors in incrementing values of said adjustable impedance and said inverted adjustable impedance.

11. An impedance controller connected to a circuit controlled by a system clock, said impedance controller comprising:

impedance control logic outputting an adjustable impedance; and a comparator comparing said adjustable impedance with a reference voltage, wherein said impedance control logic recalibrates said adjustable impedance only when said comparator indicates a change in impedance and independently of said system clock signal.

12. The impedance controller in claim 11, wherein said comparator comprises a dual differential amplifier comparator.

13. The impedance controller in claim 12, wherein said dual differential amplifier comparator includes a first differential amplifier comparator adapted to identify a high impedance and a second differential amplifier comparator adapted to identify a low impedance.

14. The impedance controller in claim 13, further comprising an alternating incremental impedance adjustment circuit adapted to converge said adjustable impedance and an inverse adjustable impedance to an amount less than said high impedance and greater than said low impedance, as controlled by said first differential amplifier and said second differential amplifier.

15. The impedance controller in claim 14, wherein said alternating incremental impedance adjustment circuit comprises:

a counter adapted to generate said adjustable impedance;

an inverter adapted to generate said inverted adjustable impedance;

a plurality of latches adapted to temporarily hold said adjustable impedance and said inverted adjustable impedance; and multiplexors that select between increment values of said adjustable impedance and said inverted adjustable impedance until one of said adjustable impedance and said inverted adjustable impedance value is substantially equivalent to said reference voltage.

16. The impedance controller in claim 15, wherein said impedance controller includes an enable signal for controlling said multiplexors in incrementing values of said adjustable impedance and said inverted adjustable impedance.

* * * * *